(12) United States Patent
Kanagawa

(10) Patent No.: US 11,281,406 B2
(45) Date of Patent: Mar. 22, 2022

(54) MEMORY SYSTEM

(71) Applicant: Kioxia Corporation, Minato-ku (JP)

(72) Inventor: Naoaki Kanagawa, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 27 days.

(21) Appl. No.: 17/005,724

(22) Filed: Aug. 28, 2020

(65) Prior Publication Data

US 2021/0303210 A1    Sep. 30, 2021

(30) Foreign Application Priority Data

Mar. 24, 2020 (JP) .............................. JP2020-053099

(51) Int. Cl.
*G06F 3/06* (2006.01)
*H01L 25/065* (2006.01)
*G11C 16/32* (2006.01)
*G11C 16/04* (2006.01)

(52) U.S. Cl.
CPC .......... *G06F 3/0659* (2013.01); *G06F 3/0604* (2013.01); *G06F 3/0679* (2013.01); *G11C 16/32* (2013.01); *H01L 25/0657* (2013.01); *G11C 16/0483* (2013.01); *H01L 2225/0651* (2013.01); *H01L 2225/06506* (2013.01)

(58) Field of Classification Search
CPC .... G06F 3/0659; G06F 3/0604; G06F 3/0679; G11C 16/32; G11C 16/0483; H01L 25/0657; H01L 2225/06506; H01L 2225/0651
See application file for complete search history.

(56) References Cited

U.S. PATENT DOCUMENTS

| 9,070,426 | B2 | 6/2015 | Kanagawa |
| 10,685,702 | B2 | 6/2020 | Binfet et al. |
| 10,706,940 | B2 | 7/2020 | Handa et al. |
| 10,720,221 | B2 | 7/2020 | Yamamoto et al. |
| 10,725,909 | B2 | 7/2020 | Yanagidaira et al. |
| 2014/0173173 | A1* | 6/2014 | Battu ................. G06F 12/0246 711/103 |
| 2017/0069362 | A1* | 3/2017 | Pekny ..................... G11C 7/04 |
| 2018/0059936 | A1* | 3/2018 | Harada ................. G11C 16/34 |
| 2018/0068727 | A1* | 3/2018 | Harada ............... G11C 11/5628 |
| 2018/0075917 | A1* | 3/2018 | Utsunomiya ....... G06F 11/1469 |

(Continued)

FOREIGN PATENT DOCUMENTS

| JP | 2019-128829 A | 8/2019 |
| JP | 2019-168845 A | 10/2019 |
| WO | WO 2016/143009 A1 | 9/2016 |

*Primary Examiner* — Charles Rones
*Assistant Examiner* — Tong B. Vo
(74) *Attorney, Agent, or Firm* — Oblon, McClelland, Maier & Neustadt, L.L.P.

(57) ABSTRACT

A memory system includes a semiconductor storage device in an embodiment that performs transfer of a command, an address, and transfer data excluding the command and the address between a controller and a nonvolatile memory. The controller and the nonvolatile memory transfer the command and the address in synchronization with a capturing signal during writing and readout, transfer the transfer data in synchronization with a synchronous control signal, and transfer the command, the address, and the transfer data in synchronization with the capturing signal during function setting for the nonvolatile memory.

15 Claims, 14 Drawing Sheets

(56) References Cited

U.S. PATENT DOCUMENTS

| | | | |
|---|---|---|---|
| 2018/0204619 A1* | 7/2018 | Futats | G11C 8/08 |
| 2018/0261260 A1* | 9/2018 | Hirashima | G11C 29/022 |
| 2018/0261290 A1* | 9/2018 | Uehara | G11C 11/5642 |
| 2018/0261291 A1* | 9/2018 | Nagao | G11C 11/5628 |
| 2019/0227749 A1* | 7/2019 | Wakchaure | G11C 16/0483 |
| 2020/0168277 A1* | 5/2020 | Kim | G11C 16/0483 |
| 2020/0225859 A1* | 7/2020 | Lee | G06F 3/0634 |
| 2021/0043240 A1* | 2/2021 | Mun | G11C 7/1087 |
| 2021/0064294 A1* | 3/2021 | Kim | G06F 13/1689 |
| 2021/0295884 A1* | 9/2021 | Kim | G11C 7/1084 |

* cited by examiner

MEMORY SYSTEM

CROSS REFERENCE TO RELATED APPLICATION

This application is based upon and claims the benefit of priority from the prior Japanese Patent Application No. 2020-053099 filed in Japan on Mar. 24, 2020, the entire contents of which are incorporated herein by reference.

FIELD

Embodiments described herein relate generally to a memory system.

BACKGROUND

In recent years, three-dimensional structuring has been attempted in response to requests for miniaturization and an increase in capacity in a semiconductor storage device such as a NAND nonvolatile memory (NAND FLASH (registered trademark) memory). In the NAND nonvolatile memory, a memory cell transistor is configured not only as an SLC (single level cell) capable of holding one-bit (binary) data but also as an MLC (multi level cell) capable of holding two-bit (quaternary) data, a TLC (triple level cell) capable of holding three-bit (octal) data, or a QLC (quad level cell) capable of holding four-bit (hexadecimal) data.

In the NAND nonvolatile memory, for setting of various operation modes, function setting (hereinafter referred to as Set Feature) is carried out.

DETAILED DESCRIPTION

A memory system in an embodiment is a memory system including: a nonvolatile memory including a first pad capable of receiving a first control signal, a second pad capable of receiving a second control signal different from the first control signal, and a third pad capable of receiving at least one of a command, an address, and data as received data; and a memory controller including a fourth pad capable of transmitting the first control signal to the nonvolatile memory, a fifth pad capable of transmitting the second control signal to the nonvolatile memory, and a sixth pad capable of transmitting the command, the address, and the data to the nonvolatile memory. The first control signal instructs the nonvolatile memory to capture a writing command and a function setting command included in the command, a writing address and a function setting address included in the address, and function setting data included in the data. The second control signal instructs the nonvolatile memory to capture writing data included in the data. When the memory controller transmits a first command sequence including the writing command, the writing address, and the writing data to the nonvolatile memory, the memory controller transmits the writing command and the writing address in synchronization with the first control signal and transmits the writing data in synchronization with the first control signal. When the memory controller transmits a second command sequence including the function setting command, the function setting address, and the function setting data to the nonvolatile memory, the memory controller transmits the function setting command, the function setting address, and the function setting data in synchronization with the first control signal.

Embodiments of the present invention are explained in detail below with reference to the drawings.

First Embodiment

This embodiment makes it possible to reduce a processing time required for a Set Feature sequence by including a temporary register that temporarily holds data (Set Feature data) transferred from a controller to a nonvolatile memory in a Set Feature sequence and performing transfer of the Set Feature data using a write enable signal /WE.

(Configuration of a Memory System)

Figure 1:
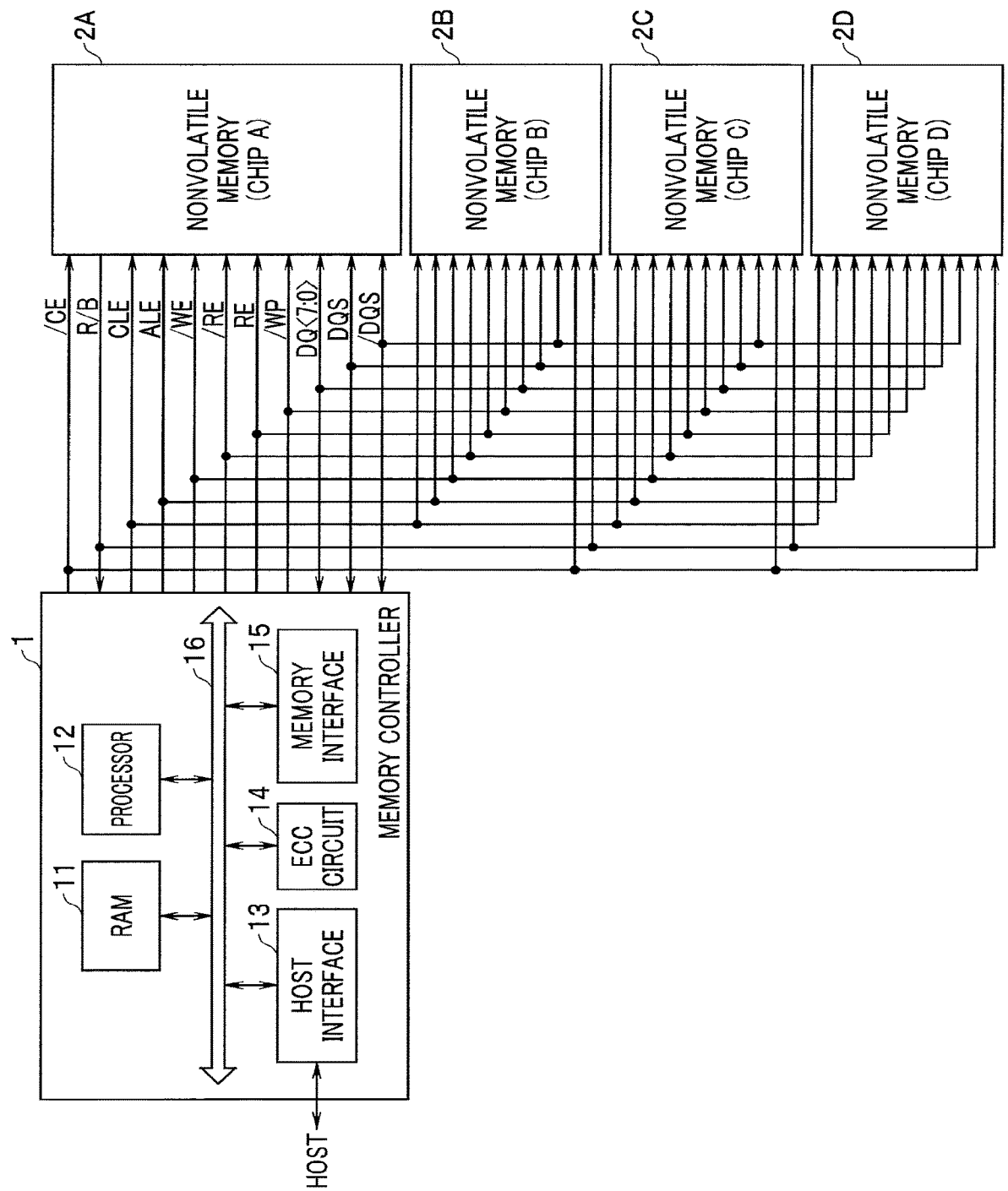
FIG. 1 is a block diagram showing a configuration example of a memory system relating to a first embodiment.

FIG. 1 is a block diagram showing a configuration example of a memory system relating to an embodiment. The memory system in this embodiment includes a memory controller 1 and one or more NAND nonvolatile memories. In FIG. 1, an example including four NAND nonvolatile memories 2A to 2D is shown. In the following explanation, when it is unnecessary to distinguish the four NAND nonvolatile memories 2A to 2D, the NAND nonvolatile memories 2A to 2D are representatively referred to as NAND nonvolatile memories 2. The NAND nonvolatile memory is simply referred to as nonvolatile memory as well. The memory system is connectable to a not-shown host. The host is an electronic device such as a personal computer or a portable terminal. The respective nonvolatile memories 2 are chipped and are sometimes stacked and arranged in a memory device.

Figure 2:
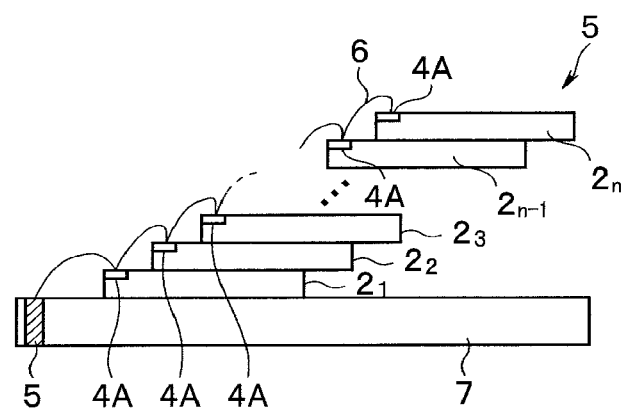
FIG. 2 is a schematic sectional view for explaining a structure example of a memory device in which nonvolatile memories 2 are stacked and arranged.

FIG. 2 is a schematic sectional view for explaining a structure example of the memory device in which the nonvolatile memories 2 are stacked and arranged. The nonvolatile memories 2 shown in FIG. 1 are respectively chipped and stacked and arranged. FIG. 2 shows an example in which n memory chips $2_1, 2_2, \ldots,$ and $2_n$ are stacked on a wiring board 7. When it is unnecessary to distinguish the n memory chips $2_1, 2_2, \ldots,$ and $2_n$, the memory chips $2_1, 2_2, \ldots,$ and $2_n$ are referred to as memory chips 2. A memory device 5 realizes high storage density and a large storage capacity with a plurality of memory chips 2.

The plurality of memory chips 2 are stacked on a substrate in order to reduce a size (an area) of a package. The stacked memory chips 2 are connected to one another using a bonding wire 6, a through-electrode, or the like.

For example, as shown in FIG. 2, when a memory chip $2_n$ of an upper layer and a memory chip $2_{n-1}$ of a lower layer are connected by the bonding wire 6, the memory chip $2_n$ of the upper layer is stacked while being shifted with a fixed interval with respect to the memory chip $2_{n-1}$ of the lower layer. Consequently, a pad 4A provided in the memory chip $2_{n-1}$ of the lower layer is exposed without being covered by the memory chip $2_n$ of the upper layer.

For example, the pads 4A of the respective memory chips 2 are connected to a common bonding wire 6 and connected to a terminal 5 of the wiring board 7. The plurality of memory chips 2 share the wire to input and output signals. Accordingly, the plurality of memory chips 2 cannot individually drive data lines. Therefore, among a plurality of nonvolatile memories (and controllers) sharing the data line, a chip capable of outputting data is only one chip.

The nonvolatile memory 2 is a semiconductor storage device that stores data in a nonvolatile manner and includes, for example, a NAND FLASH memory. As shown in FIG. 1, the memory controller 1 and the respective nonvolatile memories 2 are connected via a NAND bus. The memory controller 1 controls writing of data in the nonvolatile memory 2 according to a writing request from a host. The memory controller 1 controls readout of data from the nonvolatile memory 2 according to a readout request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another by an internal bus 16.

The host interface 13 outputs a request received from the host, writing data, which is user data, and the like to the internal bus 16. The host interface 13 transmits user data read out from the nonvolatile memory 2, a response from the processor 12, and the like to the host.

The memory interface 15 controls, based on an instruction of the processor 12, processing for writing user data and the like in the nonvolatile memory 2 and processing for reading out the user data and the like from the nonvolatile memory 2.

The processor 12 integrally controls the memory controller 1. The processor 12 is, for example, a CPU (central processing unit) or an MPU (micro processing unit). When receiving a request from the host through the host interface 13, the processor 12 performs control conforming to the request. For example, the processor 12 instructs, according to a request from the host, the memory interface 15 to write user data and parity in the nonvolatile memory 2. The processor 12 instructs, according to a request from the host, the memory interface 15 to read out the user data and the parity from the nonvolatile memory 2.

The processor 12 determines a storage region (hereinafter referred to as memory region) on the nonvolatile memory 2 for user data accumulated in the RAM 11. The user data is stored in the RAM 11 through the internal bus 16. The processor 12 carries out the determination of the memory region for data in a page unit, which is a writing unit, that is, page data. In this specification, user data stored in one page of the nonvolatile memory 2 is defined as unit data. The unit data is, for example, encoded and stored in the nonvolatile memory 2 as a codeword.

Note that the encoding is not essential. The memory controller 1 may store the unit data in the nonvolatile memory 2 without encoding the unit data. However, in FIG. 1, a configuration for performing encoding is shown as a configuration example. When the memory controller 1 does not perform the encoding, the page data coincides with the unit data. One codeword may be generated based on one unit data. One codeword may be generated based on divided data obtained by dividing the unit data. One codeword may be generated using a plurality of unit data.

The processor 12 determines, for each of the unit data, a memory region of the nonvolatile memory 2 at a writing destination. A physical address is allocated to the memory region of the nonvolatile memory 2. The processor 12 manages, using the physical address, the memory region at the writing destination of the unit data. The processor 12 designates a physical address of the determined memory region and instructs the memory interface 15 to write user data in the nonvolatile memory 2. The processor 12 manages correspondence between a logical address (a logical address managed by the host) of the user data and the physical address. When receiving a readout request including the logical address from the host, the processor 12 specifies a physical address corresponding to the logical address, designates the physical address, and instructs the memory interface 15 to read out user data.

The ECC circuit 14 encodes user data stored in the RAM 11 and generates a codeword. The ECC circuit 14 decodes a codeword read out from the nonvolatile memory 2.

The RAM 11 temporarily stores user data received from the host until the user data is stored in the nonvolatile memory 2 or temporarily stores data read out from the nonvolatile memory 2 until the data is transmitted to the host. The RAM 11 is a general-purpose memory such as an SRAM (static random access memory) or a DRAM (dynamic random access memory).

In FIG. 1, a configuration example in which the memory controller 1 includes the ECC circuit 14 and the memory interface 15 is shown. However, the ECC circuit 14 may be incorporated in the memory interface 15. The ECC circuit 14 may be incorporated in the nonvolatile memory 2.

When receiving a writing request from the host, the memory controller 1 operates as follows. The processor 12 causes the RAM 11 to temporarily store writing data. The processor 12 reads out data stored in the RAM 11 and inputs the data to the ECC circuit 14. The ECC circuit 14 encodes the input data and gives a codeword to the memory interface 15. The memory interface 15 writes the input codeword in the nonvolatile memory 2.

After receiving a readout request from the host, the memory controller 1 operates as follows. The memory interface 15 gives the codeword read out from the nonvolatile memory 2 to the ECC circuit 14. The ECC circuit 14 decodes the input codeword and stores decoded data in the RAM 11. The processor 12 transmits the data stored in the RAM 11 to the host via the host interface 13.

The processor 12 of the memory controller 1 controls the memory interface 15 and transmits a signal DQ<7:0> and data strobe signals DQS and /DQS to the nonvolatile memory 2. The signal DQ<7:0> transmitted from the memory controller 1 to the nonvolatile memory 2 includes a command, an address, and data. The data includes Set Feature data, which is setting values of various operation modes of the nonvolatile memory 2 and writing data, which is a target of a writing operation in a memory cell array 23 explained below. The data strobe signals DQS and /DQS are synchronous control signals indicating readout and writing timings that occur in synchronization with data transfer.

The processor 12 controls the memory interface 15 to transmit a chip enable signal /CE, a command latch enable signal CLE, an address latch enable signal ALE, a signal /WE, read enable signals RE and /RE, and a write protect signal /WP to the nonvolatile memory 2. The signal /CE is a signal for setting the respective nonvolatile memories 2 in an operation state. The write enable signal /WE is a signal for permitting writing. The nonvolatile memory 2 receives this signal /WE to perform capturing of a command and an address. In other words, the signal /WE may be called capturing signal. The command latch enable signal CLE is a signal for permitting latch of a command. The address latch enable signal ALE is a signal for permitting latch of an address.

A signal to which a character "/" is added at a head indicates that the signal is active low or illogical. In other words, whereas a signal to which the character "/" is not added at a head is activated at an "H" level, the signal to which the character "/" is added at the head is activated at an "L" level.

On the other hand, the nonvolatile memory 2 receives various signals from the memory controller 1 and transmits the signal DQ<7:0> and the data strobe signals DQS and /DQS to the memory controller 1 with an input/output circuit explained below. The nonvolatile memory 2 transmits a ready/busy signal R/B to the memory controller 1. A ready/busy signal R/B indicates whether the nonvolatile memory 2 is in a ready state in which the nonvolatile memory 2 is capable of receiving a command from an outside or a busy state in which the nonvolatile memory 2 cannot receive a command from the outside.

(Configuration of the Nonvolatile Memory)

Figure 3:
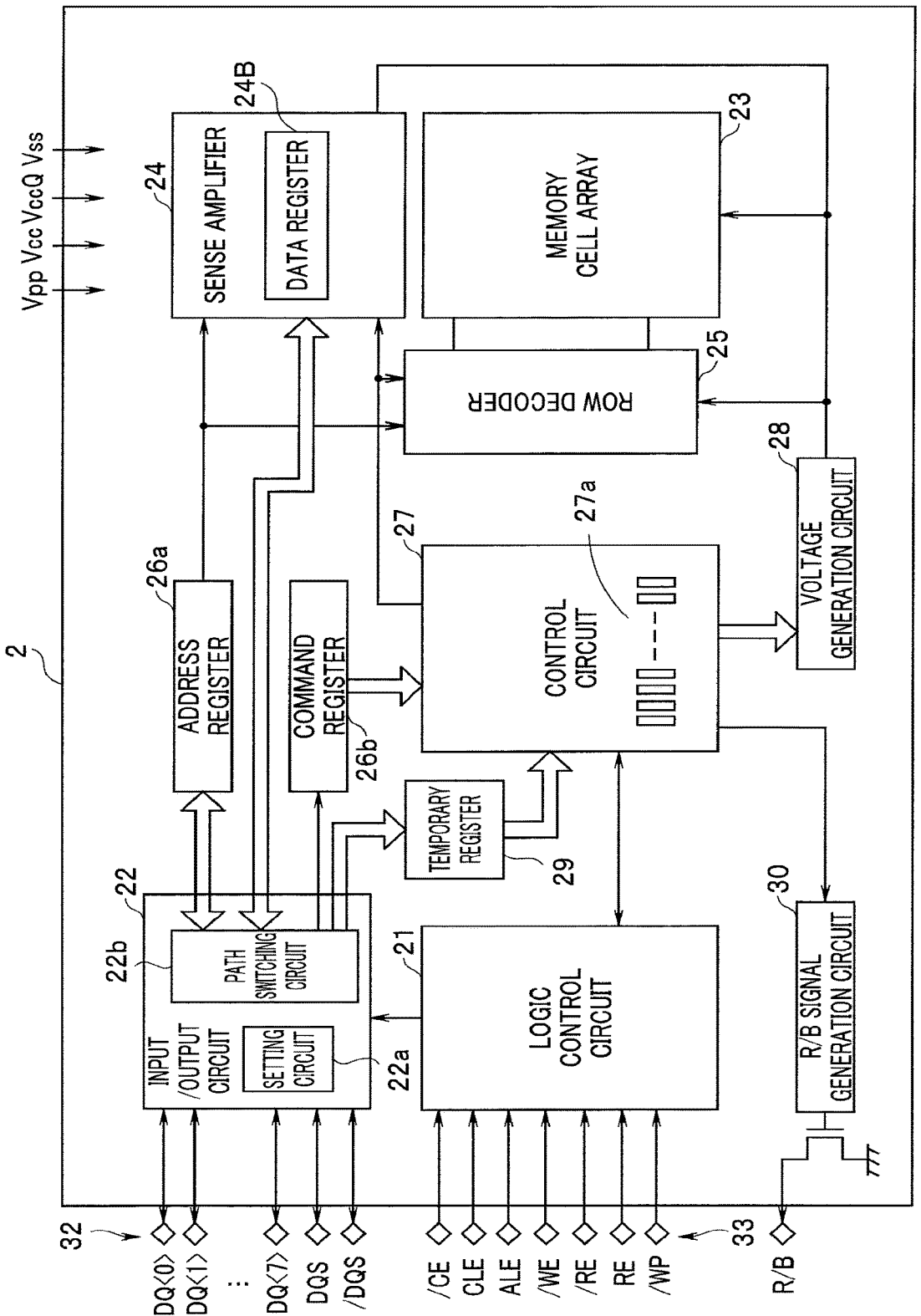
FIG. 3 is a block diagram showing a configuration example of a nonvolatile memory in the first embodiment.

FIG. 3 is a block diagram showing a configuration example of a nonvolatile memory in this embodiment. The nonvolatile memory 2 includes a logic control circuit 21, an input/output circuit 22, a memory cell array 23, a sense amplifier 24, a row decoder 25, an address register 26a, a command register 26b, a control circuit 27, a voltage generation circuit 28, a temporary register 29, an R/B signal generation circuit 30, a pad group for input and output 32, and a pad group for logic control 33.

The memory cell array 23 includes a plurality of blocks (memory blocks). Each of the plurality of blocks BLK includes a plurality of memory cell transistors (memory cells). In the memory cell array 23, a plurality of bit lines, a plurality of word lines, a source line, and the like are disposed in order to control a voltage applied to the memory cell transistors.

The pad group for input and output 32 includes a plurality of terminals (pads) corresponding to the signal DQ<7:0> and the data strobe signals DQS and /DQS in order to perform transmission and reception of respective signals including data between the pad group for input and output 32 and the memory controller 1.

The pad group for logic control 33 includes a plurality of terminals (pads) corresponding to the chip enable signal /CE, the command latch enable signal CLE, the address latch enable signal ALE, the write enable signal /WE, the read enable signals RE and /RE, and the write protect signal /WP in order to perform transmission and reception of respective signals between the pad group for logic control 33 and the memory controller 1.

The logic control circuit 21 and the input/output circuit 22 are connected to the memory controller 1 via a NAND bus.

The logic control circuit 21 receives external control signals (for example, the chip enable signal /CE, the command latch enable signal CLE, the address latch enable signal ALE, the writing enable signal /WE, the readout enable signals RE and /RE, and the write protect signal /WP) from the memory controller 1 via the NAND bus. The R/B signal generation circuit 30 transmits a ready/busy signal R/B to the memory controller 1 via the NAND bus.

The address register 26a holds an address. The command register 26b holds a command. The address register 26a and the command register 26b are configured by, for example, an SRAM.

Various operation power supplies, power supply voltages Vcc, VccQ, and Vpp, and a ground voltage Vss are supplied to the nonvolatile memory 2 from the outside. Note that the power supply voltage Vcc is a circuit power supply voltage generally given from the outside as an operation power supply and is, for example, a voltage of approximately 2.5 V. The power supply voltage VccQ is, for example, a voltage of 1.2 V. The power supply voltage VccQ is used when signals are transmitted and received between the memory controller 1 and the nonvolatile memory 2. The power supply voltage Vpp is a power supply voltage higher than the power supply voltage Vcc and is, for example, a voltage of 12 V.

The control circuit 27 receives a command from the command register 26b and controls the nonvolatile memory 2 according to a sequence based on the command.

The voltage generation circuit 28 is controlled by the control circuit 27 to receive a power supply voltage from the outside of the nonvolatile memory 2 and generate a plurality of voltages necessary for a wiring operation, a readout operation, and an erasing operation using the power supply voltage. The voltage generation circuit 28 supplies the generated voltage to the memory cell array 23, the sense amplifier 24, the row decoder 25, and the like.

The row decoder 25 receives a row address from the register 26 and decodes the row address. The row decoder 25 performs a selecting operation for a word line based on the decoded row address. The row decoder 25 transfers the plurality of voltages necessary for the wiring operation, the readout operation, and the erasing operation to a selected block.

The sense amplifier 24 receives a column address from the register 26 and decodes the column address. The sense amplifier 24 selects any bit line based on the decoded column address. During readout of data, the sense amplifier 24 detects and amplifies data read out from the memory cell transistor to the bit line. During writing of data, the sense amplifier 24 transfers the writing data to the bit line.

The sense amplifier 24 includes a data register 24B. During readout of data, the data register 24B holds data detected by the sense amplifier 24 and serially transfers the data to the input/output circuit 22. During writing of data, the data register 24B holds the data serially transferred from the input/output circuit 22 and transfers the data to the sense amplifier 24. The data register 24B is configured by an SRAM or the like.

(Input/Output Control)

The input/output circuit 22 is controlled by the logic control circuit 21 to transmit and receive the signal DQ (for example, DQ0 to DQ7) and the signals DQS and /DQS between the input/output circuit 22 and the memory controller 1 via the NAND bus.

The input/output circuit 22 is configured to, when the signal DQ is given together with the signal DQS and /DQS, receive the signal DQ as data in synchronization with the signals DQS and /DQS. The input/output circuit 22 transmits, according to a signal RE given to the logic control circuit 21, data read out from the memory cell array 23 to the memory controller 1 as the signal DQ together with the signals DQS and /DQS.

The input/output circuit 22 includes a setting circuit 22a and a path switching circuit 22b. The setting circuit 22a is controlled by the logic control circuit 21 to change setting of the input/output circuit 22 to enable signal transfer corresponding to the signal /WE and signal transfer corresponding to the signals DQS and /DQS. The path switching circuit 22b is controlled by the logic control circuit 21 to select an output path for various signals received by the input/output circuit 22.

The logic control circuit 21 determines, with an address C_ADD, whether signal transfer between the memory controller 1 and the addressed nonvolatile memory 2 is designated by the memory controller 1. The logic control circuit 21 controls the path switching circuit 22b according to the signal CLE and is capable of outputting a command received as the signal DQ to the command register 26b. The logic control circuit 21 controls the path switching circuit 22b according to the signal ALE to make it possible to output an address received as the signal DQ to the address register 26a. The logic control circuit 21 causes, in synchronization with the signal /WE, the input/output circuit 22 to output a signal received by the input/output circuit 22 to the respective sections and enable writing of the signal.

The path switching circuit 22b selects the command register 26b based on the signal supplied from the logic control circuit 21 when the signal CLE is activated and selects the address register 26a based on a signal supplied from the logic control circuit 21 when the signal ALE is activated. In other words, the signal CLE is a control signal for enabling command storage in the command register 26b. The signal ALE is a control signal for enabling address storage in the address register 26a. As explained below, the path switching circuit 22b is configured to, concerning data (writing data) excluding the Set Feature data, select the data register 24B of the sense amplifier 24 and transfer the data.

When receiving the signal /WP, the logic control circuit 21 prohibits writing and erasing.

When a command is given from the command register 26b, the control circuit 27 analyzes the command and controls the logic control circuit 21 based on a result of the analysis. The logic control circuit 21 is configured to control the path switching circuit 22b according to the control.

(Set Feature Sequence in a Comparative Example)

Figure 4:
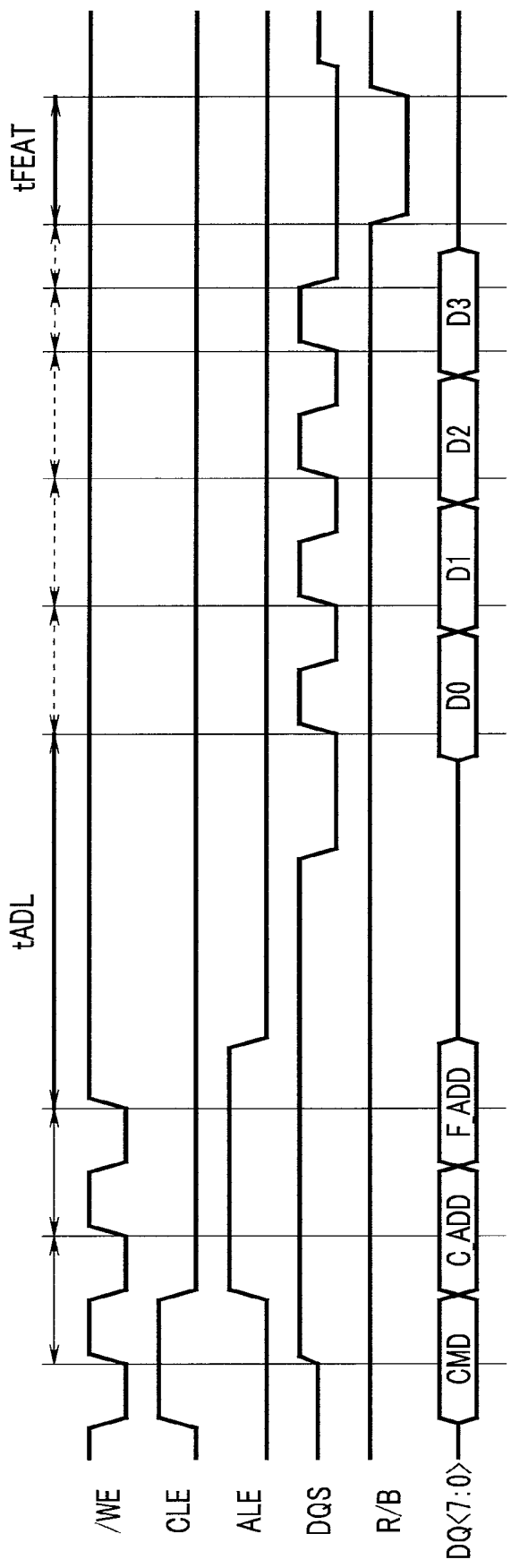
FIG. 4 is a timing chart for explaining a Set Feature sequence in a comparative example.

In the nonvolatile memory, function setting (Set Feature) is carried out for setting of various operation modes. FIG. 4 is a timing chart for explaining a Set Feature sequence of a NAND nonvolatile memory in a comparative example.

The write enable signal /WE is a signal for permitting writing. The NAND nonvolatile memory receives the signal /WE to capture a command and an address. In other words, the signal /WE may be called capturing signal. The command latch enable signal CLE is a signal for permitting latch of a command. The address latch enable signal ALE is a signal for permitting latch of an address. The data strobe signals DQS and /DQS are synchronous control signals indicating timing of reading that occurs in synchronization with data transfer. The ready/busy signal R/B indicates whether the NAND nonvolatile memory is in a ready state in which the NAND nonvolatile memory is capable of receiving a command from the outside or a busy state in which the NAND nonvolatile memory cannot receive a command from the outside. The signal DQ<7:0> indicates a command, an address, and data that are input and output. The signal DQ<7:0> and the data strobe signal DQS and /DQS are input to and output from the nonvolatile memory 2 respectively via corresponding pads in the pad group for input and output 32. The write enable signal /WE, the command latch enable signal CLE, the address latch enable signal ALE, and the ready/busy signal R/B are input to and output from the nonvolatile memory 2 respectively via corresponding pads in the pad group for logic control 33.

The signal /WE is used for transfer of a command and an address at a relatively low single data rate. The signals DQS and /DQS are used for transfer of writing data at a relatively high double data rate and used for transfer of Set Feature data at a relatively low single data rate.

As shown in FIG. 4, a Set Feature command CMD, a chip address C_ADD, and a Feature address F_ADD received as the signal DQ<7:0> are respectively sequentially captured in the NAND nonvolatile memory in synchronization with one clock (pulse) of the signal /WE. The address C_ADD is an address for specifying a predetermined NAND nonvolatile memory and, for example, when the chip enable signal /CE is given to a plurality of NAND nonvolatile memories in common, designates a NAND nonvolatile memory set as an operation target. The address F_ADD is an address of a Feature register that should store the Set Feature data (in FIG. 4, D0 to D3).

In a comparative example, the Set Feature data is transferred using the signals DQS and /DQS. In other words, as shown in FIG. 4, the Set Feature data D0 to D3 received as the signal DQ<7:0> are respectively sequentially captured in synchronization with one clock (pulse) of the signals DQS and /DQS.

In the data transfer using the signal /WE and the data transfer using the signals DQS and /DQS, processing schemes and the like are different. In the Set Feature sequence shown in FIG. 4, a wait time tADL shown in FIG. 4 is necessary in order to change, for example, circuit setting from when the capturing of the address F_ADD synchronizing with the signal /WE is completed until when capturing of the data D0 synchronizing with the signals DQS and /DQS can be started. The wait time tADL is schematically described as a short period in FIG. 4. However, actually, considering a margin, the wait time tADL extends to, for example, several tens of times of a period for consecutively reversing (toggling) the signal /WE.

In the Set Feature sequence shown in FIG. 4, a wait time tFEAT for reflecting the Set Feature data on processing to enable next processing is necessary from when capturing of the last data D3 of the Set Feature data is completed. In other words, the wait time tFEAT is a preparation period for, after transfer of the Set Feature data, enabling operation by setting corresponding to the Set Feature data. The wait time tFEAT is schematically described as a short period in FIG. 4. However, actually, the wait time tFEAT sometimes extends to, for example, several hundreds of times of a period for consecutively reversing (toggling) the signal /WE.

In this way, in the Set Feature sequence in the comparative example, a relatively long processing time is required until processing is actually enabled from a reception start of the Set Feature command because of the wait times tADL and tFEAT.

(Set Feature Sequence in the Embodiment)

In the comparative example explained above, the Set Feature command is received by the signal /WE and, as a result of analyzing the command in the control circuit, a transfer destination of the Set Feature data is determined. In the comparative example, in the wait time tADL, the control circuit controls the logic control circuit and the input/output circuit based on an analysis result of a command to perform path selection for received data. Therefore, the processor of the memory controller needs to retain transmission of the Set Feature data and the signals DQS and /DQS for the wait time tADL after transmitting the address F_ADD and the signal /WE.

On the other hand, in this embodiment, the processor 12 of the memory controller 1 performs control to transfer the Set Feature data to the nonvolatile memory 2 using the signal /WE and write the Set Feature data in the nonvolatile memory 2. Consequently, the setting circuit 22a does not need to perform circuit setting before the transfer of the Set Feature data. Further, in this embodiment, the processor 12 activates the signal CLE and the signal ALE during the transfer of the Set Feature data. In normal data transfer, since an address and a command are not simultaneously transferred, the signal CLE and the signal ALE are not simultaneously activated. In this embodiment, the signal CLE and the signal ALE are simultaneously activated to notify transmission timing of the Set Feature data to the nonvolatile memory 2.

When receiving, from the logic control circuit 21, a signal indicating that the signal CLE and the signal ALE have been simultaneously activated, the path switching circuit 22b switches a transfer destination of the reception signal DQ of the input/output circuit 22 to the temporary register 29. The temporary register 29 is a register that temporarily holds the Set Feature data. The temporary register 29 outputs the held Set Feature data to the control circuit 27 in a first-in first-out manner. The control circuit 27 includes a Feature register 27a that stores the Set Feature data. The Feature register 27a includes a plurality of regions capable of respectively storing a plurality of kinds of Set Feature data. The control circuit 27 stores the Set Feature data from the temporary register 29 in a region of the Feature register 27a corresponding to the Set Feature command.

Note that, after transferring the Set Feature data using the signal /WE, the processor 12 of the memory controller 1 transfers a next control signal to the nonvolatile memory 2 after a predetermined time sufficiently shorter than the wait time tFEAT. For example, during transfer of the Set Feature data for shift read, the control circuit 27 can complete preparation of a shift read operation in the respective sections of the nonvolatile memory 2 in a relatively short time after the transfer of the Set Feature data. Therefore, concerning a predetermined Set Feature of the shift read or the like, there is no problem even if the next control signal may be transferred to the nonvolatile memory 2 after a predetermined time sufficiently shorter than the wait time tFEAT.

Figure 5:
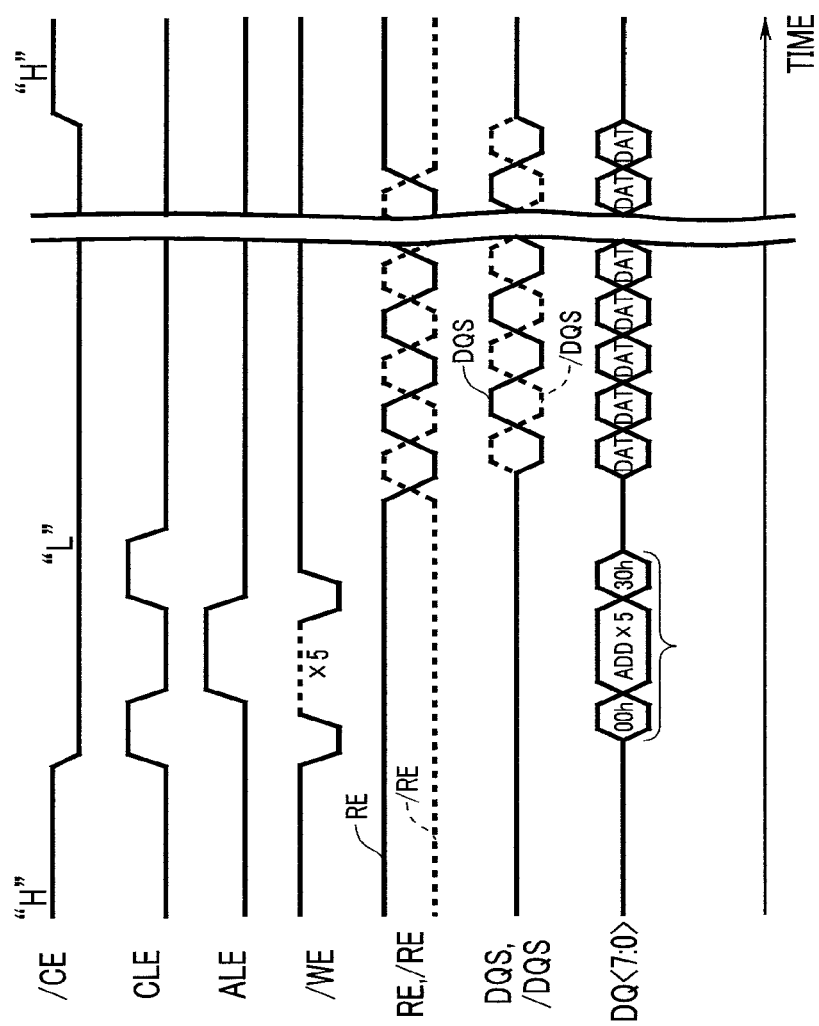
FIG. 5 is a timing chart showing a command sequence in a readout operation including shift read.
Figure 6:
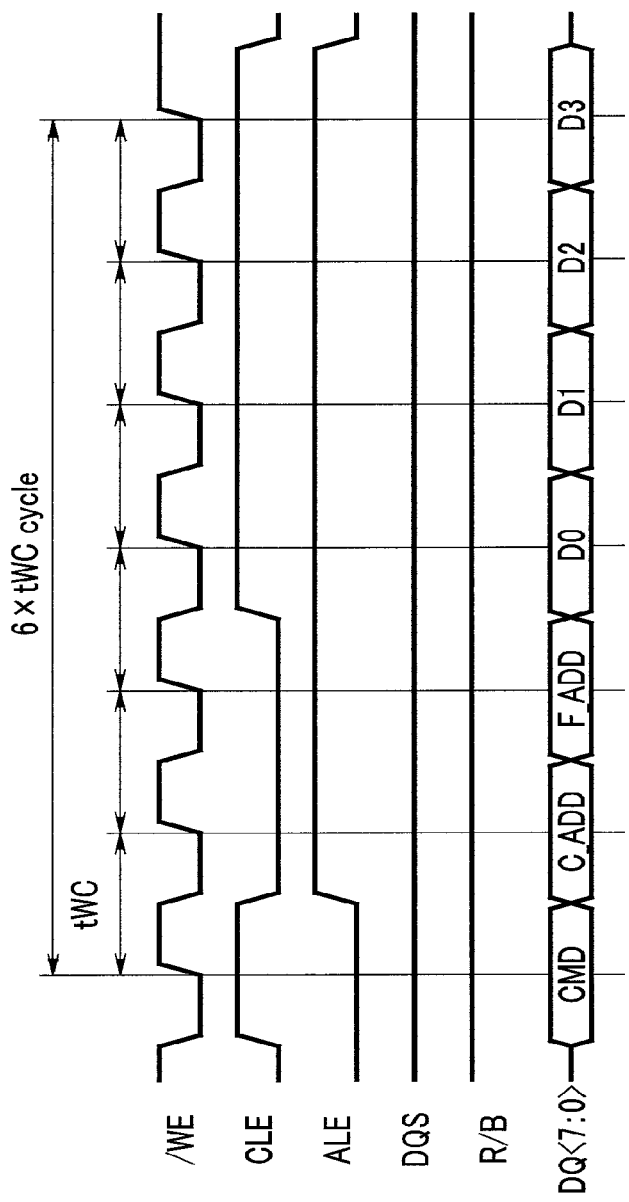
FIG. 6 is a timing chart showing a Set Feature sequence in the first embodiment.
Figure 7:
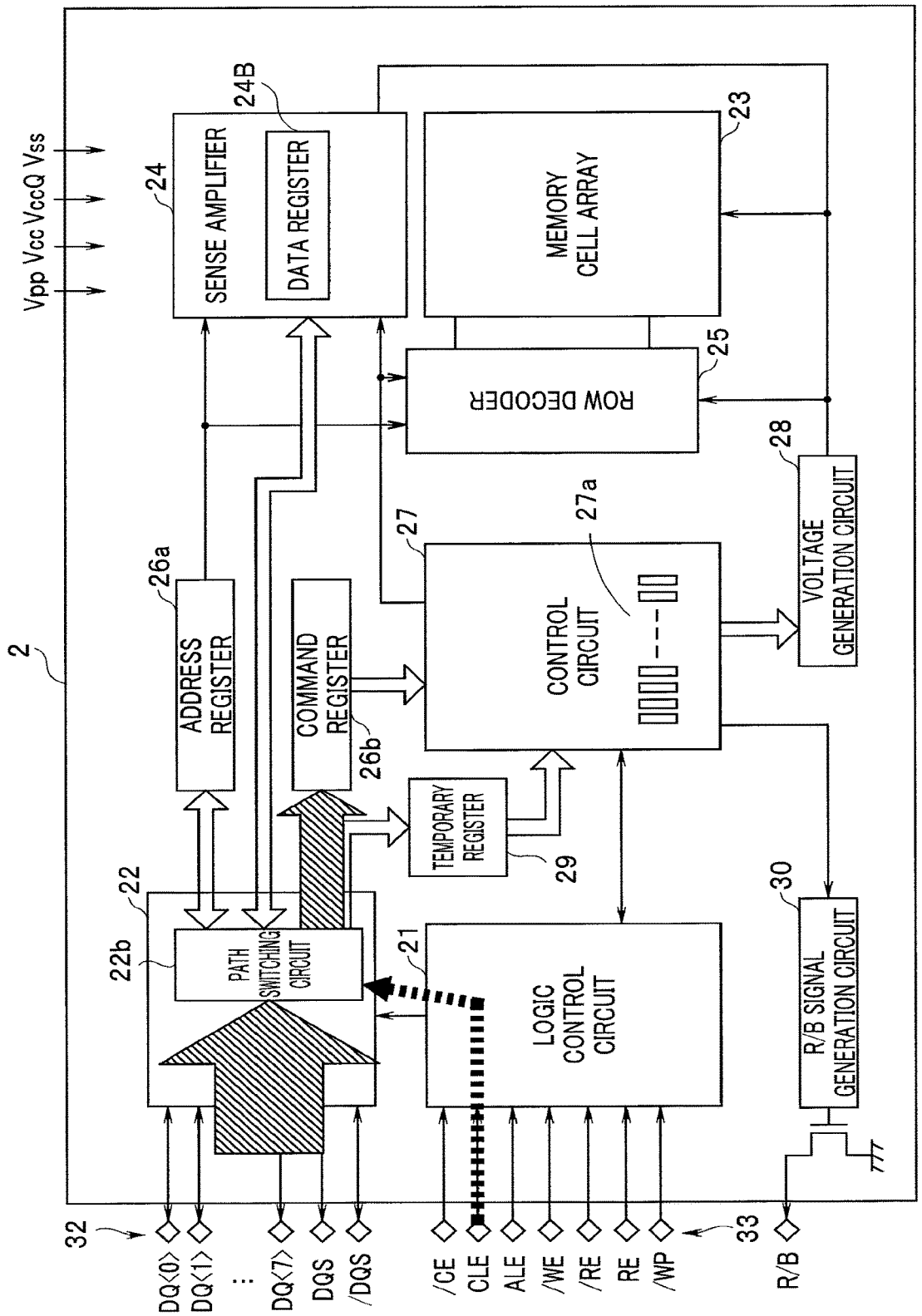
FIG. 7 is an explanatory diagram for explaining operation in the first embodiment.
Figure 8:
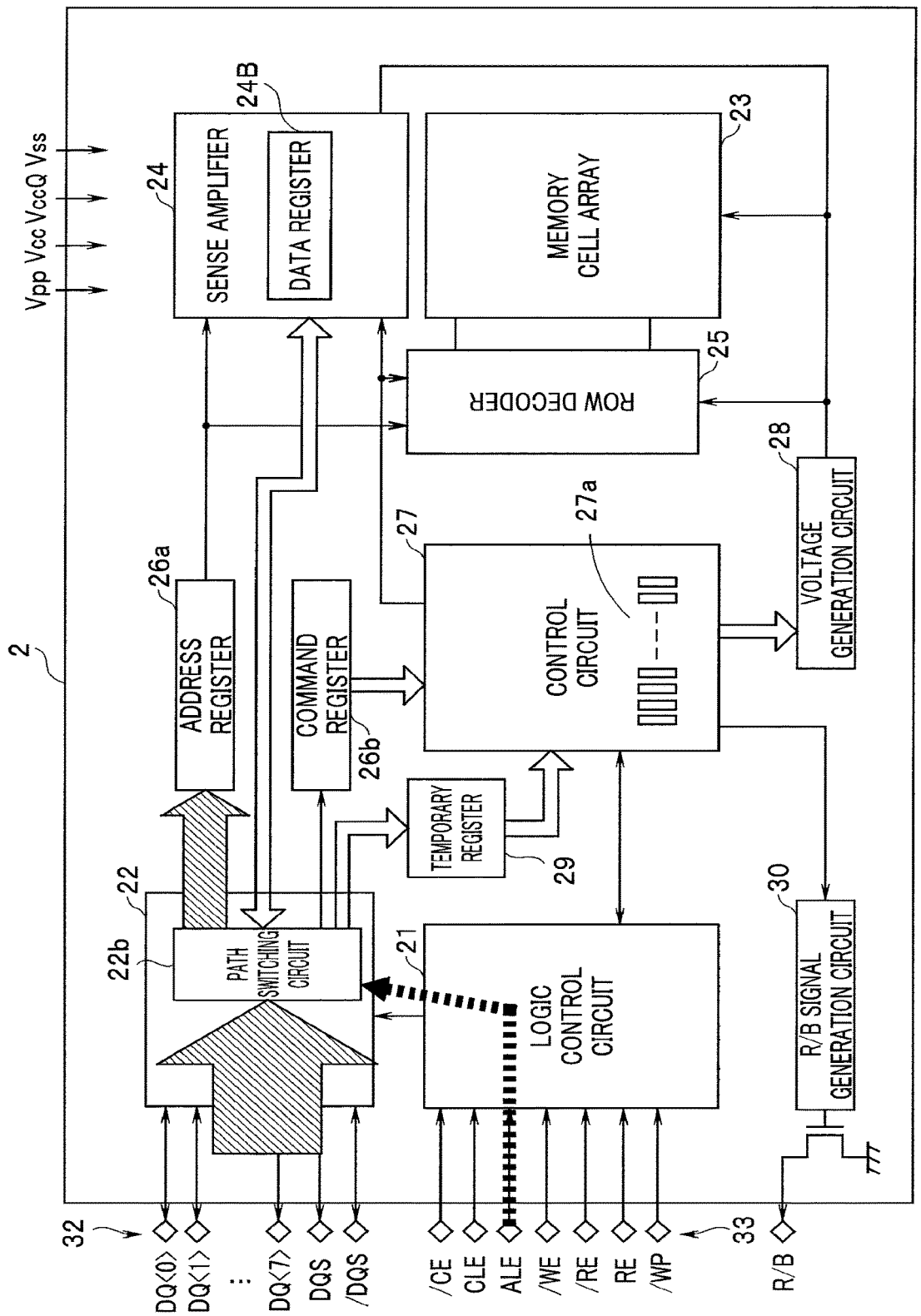
FIG. 8 is an explanatory diagram for explaining operation in the first embodiment.
Figure 9:
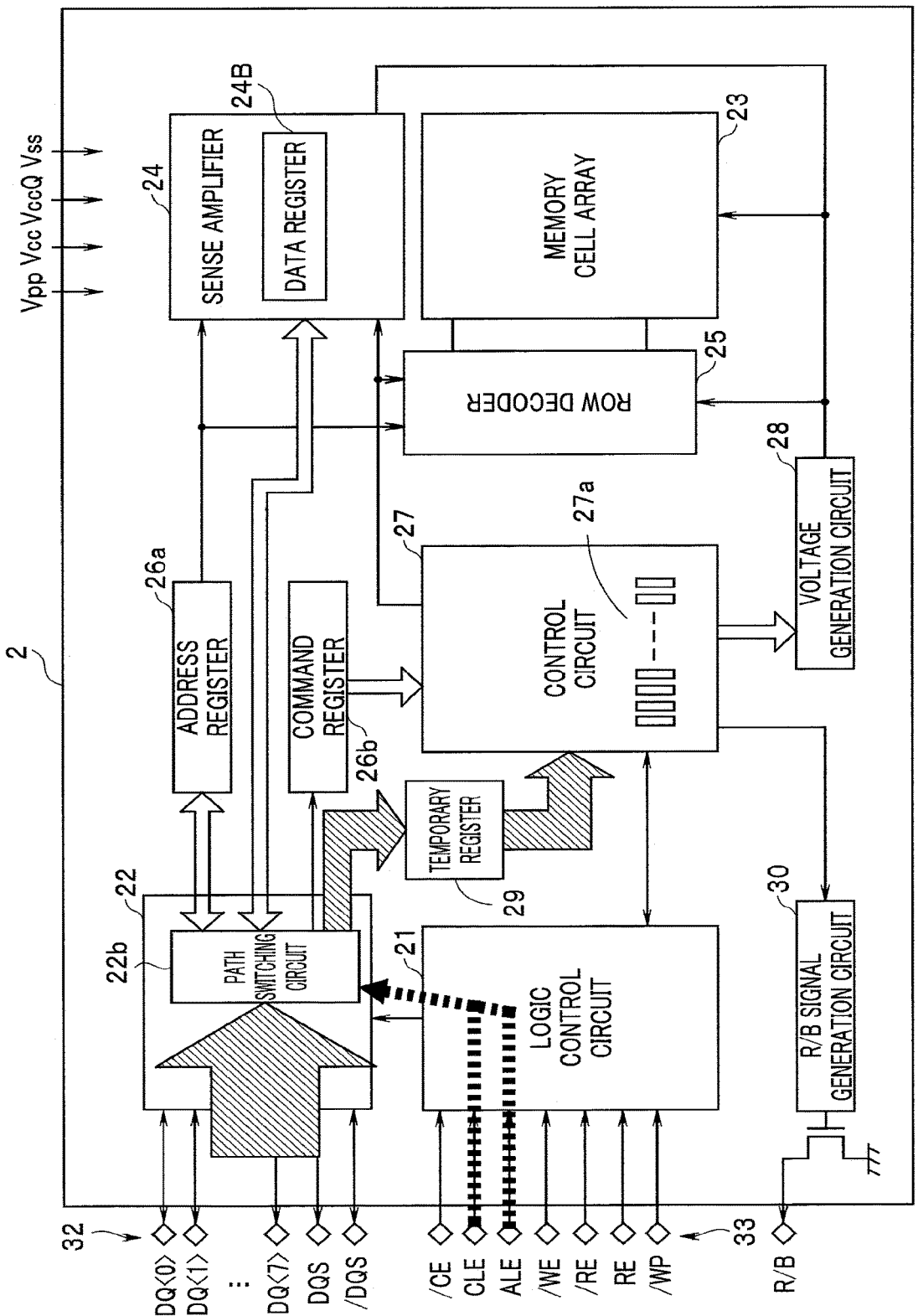
FIG. 9 is an explanatory diagram for explaining operation in the first embodiment.

Operation in the embodiment configured as explained above is explained with reference to FIGS. 5 to 9. FIG. 5 is a timing chart showing a command sequence in a readout operation including shift read. FIG. 6 is a timing chart showing a Set Feature sequence in the first embodiment. FIGS. 7 to 9 are explanatory diagrams for explaining the operation in the first embodiment.

In this embodiment, concerning command sequences such as a writing operation and a readout operation other than the Set Feature sequence, normal general sequences are adopted. For example, the readout operation is explained with reference to FIG. 5.

During the readout operation, the processor 12 of the memory controller 1 activates the signal /CE for changing the respective nonvolatile memories 2 to an operating state. The processor 12 activates the signal CLE and the signal /WE, generates a readout command "00h", subsequently activates the signal ALE and the signal /WE and generates a readout address, and, finally, activates the signal CLE and the signal /WE and generates a command "30h" for instructing the nonvolatile memory 2 to execute a command.

The input/output circuit 22 is controlled to read the readout command "00h" according to the signal CLE and the signal /WE. FIG. 7 shows, with a hatched arrow, a transfer path for the reception signal DQ<7:0> in this case. The path switching circuit 22b selects the command register 26b according to a signal from the logic control circuit 21 corresponding to the signal CLE and writes the signal DQ<7:0> received in the input/output circuit 22 in the command register 26b according to the signal /WE.

Subsequently, the input/output circuit 22 is controlled by the logic control circuit 21 and reads a readout address according to the signal ALE and the signal /WE. FIG. 8 shows, with a hatched arrow, a transfer path for the reception signal DQ<7:0> in this case. The path switching circuit 22b selects the address register 26a according to a signal from the logic control circuit 21 corresponding to the signal ALE and writes the signal DQ<7:0> received in the input/output circuit 22 in the address register 26a according to the signal /WE.

Subsequently, the input/output circuit 22 is controlled by the logic control circuit 21 to read the execution command "30h" according to the signal CLE and the signal /WE. In this case, as shown in FIG. 7, the path switching circuit 22b selects the command register 26b according to a signal from the logic control circuit 21 corresponding to the signal CLE and writes the signal DQ<7:0> received in the input/output circuit 22 in the command register 26b according to the signal /WE.

Subsequently, the processor 12 generates the signals RE and /RE and starts readout. The control circuit 27 reads out data from the memory cell array 23 based on the signals RE and /RE received in the input/output circuit 22 and transfers the data to the memory controller 1 via the input/output circuit 22. In this case, the input/output circuit 22 generates the signals DQS and /DQS and transmits transfer data (DAT) in synchronization with the signals DQS and /DQS. The readout of the data is performed in this way.

A Set Feature sequence is explained with reference to FIGS. 6 and 9.

As shown in FIG. 6, in the Set Feature sequence, the processor 12 of the memory controller 1 consecutively activates the signal /WE in a period tWC without causing the wait time tADL and the like to intervene from a start to an end of the Set Feature sequence. In an example shown in FIG. 6, from the start to the end of the Set Feature sequence, the signal /WE is represented as seven pulse waveforms (waveforms changing from an "H" level to an "L" level and changing to the "H" level again) of the signal /WE and is activated seven times. In the following explanation, pulses of the signal /WE are referred to as N-th time pulls of the signal /WE (N is 1, 2, 3, . . . ) from the start of the Set Feature sequence.

During the start of the Set Feature sequence, the processor 12 activates the signal CLE, generates the Set Feature command CMD, and activates the signal /WE to cause the nonvolatile memory 2 to capture the Set Feature command CMD. Subsequently, the processor 12 activates the signal ALE and consecutively generates the address C_ADD and the address F_ADD (equivalent to second-time and third-time pulses in FIG. 6) to cause the nonvolatile memory 2 to capture the address C_ADD and the address F_ADD.

Subsequently, in this embodiment, the processor 12 continuously maintains the signal ALE active and transitions the signal CLE to active and maintains that state. The processor 12 generates Set Feature data D0 to D3 and activates the signal /WE respectively according to the Set Feature data D0 to D3 (equivalent to fourth-time to seventh-time pulses in FIG. 6) to cause the nonvolatile memory 2 to capture the Set Feature data D0 to D3.

Note that although not shown in FIG. 6, immediately after the transfer of the Set Feature data, the processor 12 transmits a next command after a time sufficiently shorter than the wait time tFEAT. Consequently, a reduction in a processing time can be achieved. This embodiment is effective for, in particular, Set Feature such as shift read.

On the other hand, when the signal CLE is at the "H" level, the logic control circuit 21 of the nonvolatile memory 2 controls the input/output circuit 22 according to a first-time pulse of the signal /WE and causes the command register 26b to store the Set Feature command CMD, which is the reception signal DQ<7:0>. In this case, the path switching circuit 22b selects the command register 26b according to the signal CLE. The Set Feature command CMD is stored in the command register 26b.

Subsequently, when the signal ALE is at the "H" level, the logic control circuit 21 of the nonvolatile memory 2 controls the input/output circuit 22 according to a second-time pulse of the signal /WE and causes the address register 26a to store the address C_ADD, which is the reception signal DQ<7:0>. In this case, the path switching circuit 22b selects the address register 26a according to the signal ALE. The address C_ADD is stored in the address register 26a. Note that it is seen, with the address C_ADD, whether the Set Feature data is transferred to the nonvolatile memory 2 to which the data is addressed.

Further, when the signal ALE is at the "H" level, the logic control circuit 21 of the nonvolatile memory 2 controls the input/output circuit 22 according to a third-time pulse of the signal /WE and causes the address register 26a to store the address F_ADD, which is the reception signal DQ<7:0>. In this case, the path switching circuit 22b selects the address register 26a according to the signal ALE. The address F_ADD is stored in the address register 26a.

In this embodiment, after the third-time pulse of the signal /WE and after the period tWC, the logic control circuit 21 can receive a fourth-time pulse of the signal /WE without the wait time tADL intervening. Before the reception of the fourth-time pulse of the signal /WE, the signal ALE at the "H" level and the signal CLE at the "H" level are input to the logic control circuit 21. The logic control circuit 21 controls the input/output circuit 22 based on the signal /WE to receive the Set Feature data, which is the reception signal DQ<7:0>. When both of the signal ALE and the signal CLE are active, the logic control circuit 21 causes the path switching circuit 22b to select a path.

FIG. 9 shows, with a hatched arrow, a transfer path for the reception signal DQ<7:0> in this case. As shown in FIG. 9, when both of the signal ALE and the signal CLE are active, the command register 26b selects the temporary register 29. Consequently, the Set Feature data received by the input/output circuit 22 is transferred to and stored in the temporary register 29. The Set Feature data (D0 to D3) supplied when both of the signal ALE and the signal CLE are active is transferred to and stored in the temporary register 29 according to the fourth-time to seventh-time pulses of the signal /WE.

A command stored in the command register 26b is transferred to the control circuit 27 and analyzed. The control circuit 27 requires time to analyze the Set Feature command. A result of the analysis is sometimes obtained after the reception of the Set Feature data. In this embodiment, the temporary register 29 that temporarily stores the Set Feature data is provided. When both of the signal ALE and the signal CLE are active, the path switching circuit 22b selects the temporary register 29. The Set Feature data received following the address F_ADD according to the pulses of the consecutively supplied signal /WE is also surely transferred to and stored in the temporary register 29. After the analysis of the Set Feature command, the control circuit 27 reads out the address F_ADD of the address register 26a and stores the Set Feature data transferred to the temporary register 29 in a region corresponding to the Feature register 27a.

As explained above, in this embodiment, the memory controller transfers, according to the consecutively generated signal /WE, not only the Set Feature command and address but also the Set Feature data and notifies the transfer of the Set Feature data according to states of the signal ALE and the signal CLE that do not occur in normal writing and readout. On the other hand, in the nonvolatile memory, the temporary register that temporarily holds the Set Feature data is provided. By controlling the path switching circuit according to the signal ALE and the signal CLE, even before the analysis of the Set Feature command, the temporary resister can be selected as a transfer destination of the Set Feature data. Consequently, it is possible to surely store the Set Feature data in a corresponding region of the Feature register and carry out the Set Feature sequence without requiring a wait time. It is possible to reduce a processing time for the Set Feature sequence.

In the Set Feature sequence in the comparative example shown in FIG. 4, the Set Feature command CMD, the chip address C_ADD, and the Feature address F_ADD are captured by the signal /WE. On the other hand, the Set Feature data is captured by the signals DQS and /DQS. In other words, in the Set Feature sequence in the comparative example, the data transfer using the signal /WE and the signals DQS and /DQS are mixed. Therefore, the wait time tADL for switching processing schemes and the like for the data transfer and the signals DQS and /DQS is necessary. On the other hand, in this embodiment, the Set Feature command CMD, the chip address C_ADD, the Feature address F_ADD, and the Set Feature data are captured by only the signal /WE. In other words, a target of signal capturing by the signal /WE is not limited to the command and the address and is expanded to the Set Feature data. Therefore, in the Set Feature sequence in this embodiment, the wait time tADL for switching the processing schemes and the like is unnecessary. Since the capturing of the Set Feature data is performed at a single data rate, the capturing of the Set Feature data is not greatly deteriorated even if the signal /WE is used rather than the signals DQS and /DQS.

Second Embodiment

Figure 10:
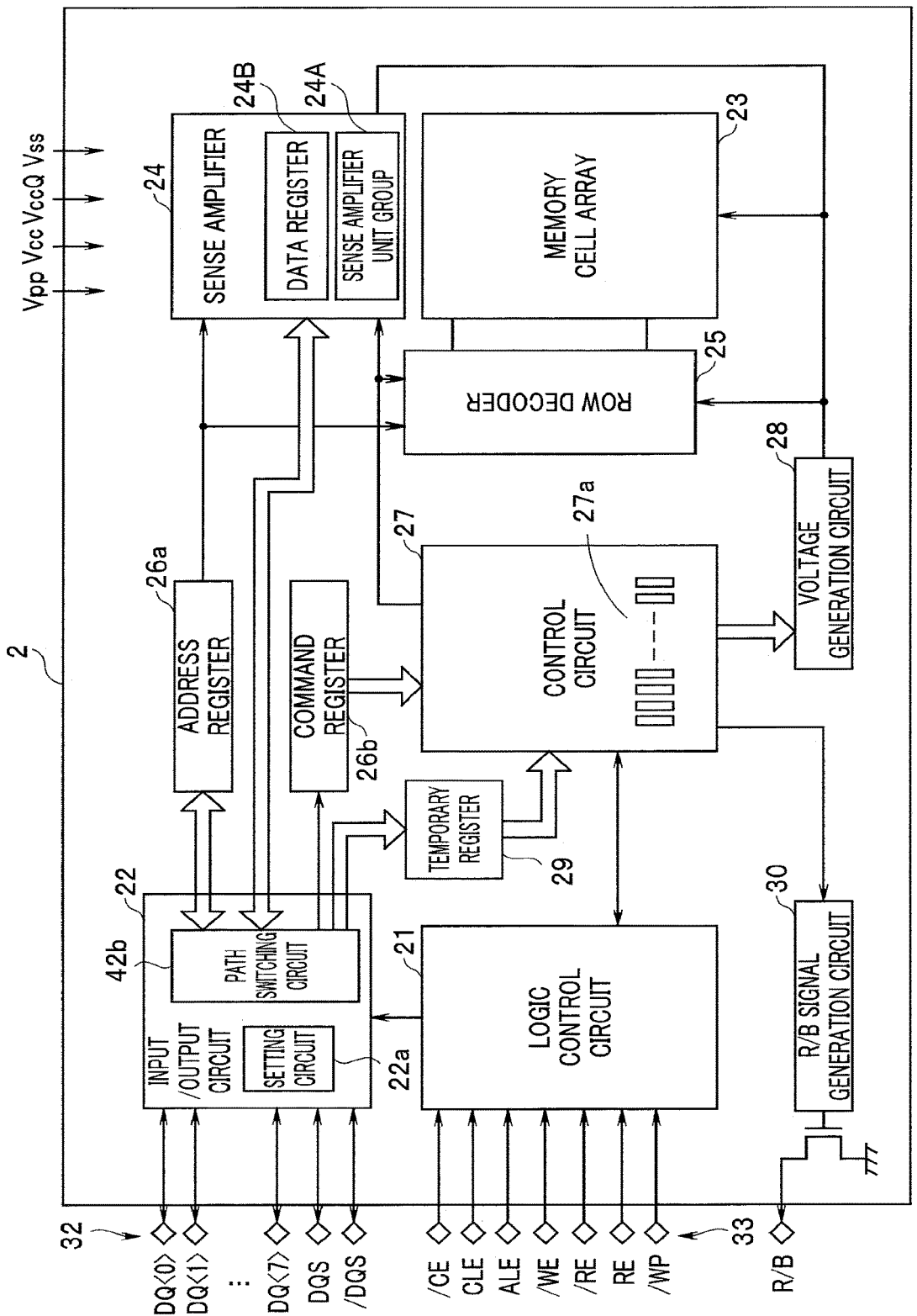
FIG. 10 is a block diagram showing a second embodiment.

FIG. 10 is a block diagram showing a second embodiment. In FIG. 10, the same components as the components shown in FIG. 3 are denoted by the same reference numerals and signs, and explanation of the components is omitted. A hardware configuration of the memory controller 1 in this embodiment is the same as the hardware configuration shown in FIG. 1.

In this embodiment, as in the first embodiment, a pulse of the signal /WE is consecutively supplied at a predetermined period, for example, the period tWC. Data necessary for a Set Feature sequence is transferred according to the pulse of the signal /WE. In the first embodiment, an example is explained in which the transfer of the Set Feature data is notified by simultaneously activating the signal ALE and the signal CLE. On the other hand, in this embodiment, an example is explained in which the signal ALE and the signal CLE are not simultaneously activated in the same manner as usual.

The nonvolatile memory 2 shown in FIG. 10 is different from the nonvolatile memory 2 shown in FIG. 3 in that a path switching circuit 42b is adopted in place of the path switching circuit 22b. Like the path switching circuit 22b, the path switching circuit 42b selects the command register 26b based on the signal CLE being active and selects the address register 26a based on the signal ALE being active.

In this embodiment, the path switching circuit 42b is configured to, when transfer data excluding the signal CLE and the signal ALE, that is, transfer data including the Set Feature data is received in the input/output circuit 22, select both of the data register 24B of the sense amplifier 24 and the temporary register 29 and transfer received data. Further, in this embodiment, the control circuit 27 is configured to, when obtaining, according to a command read out from the command register 26b, an analysis result indicating that the Set Feature data is received in the input/output circuit 22, control the logic control circuit 21 to continue the transfer of the Set Feature data to the temporary register 29 and stop the data transfer to the data register 24B.

The logic control circuit 21 is controlled by the control circuit 27 to control the path switching circuit 42b. In this way, the path switching circuit 42b continues the transfer of the Set Feature data received by the input/output circuit 22 to the temporary register 29 and stops the transfer of the data register 24B ex post facto.

Figure 11:
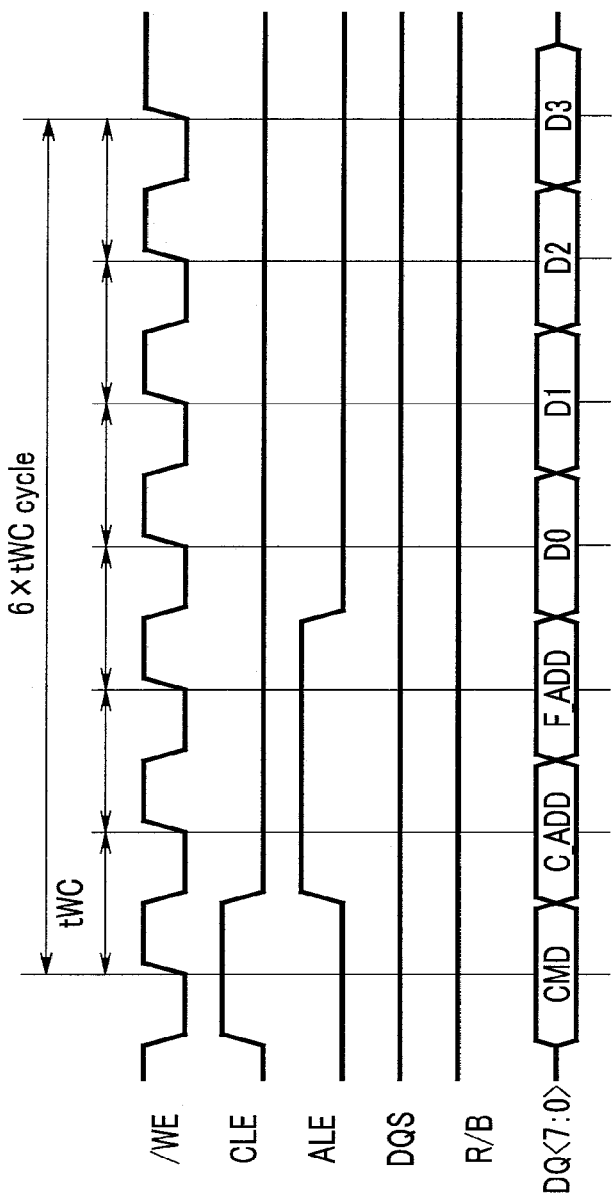
FIG. 11 is a timing chart showing a Set Feature sequence in the second embodiment.
Figure 12:
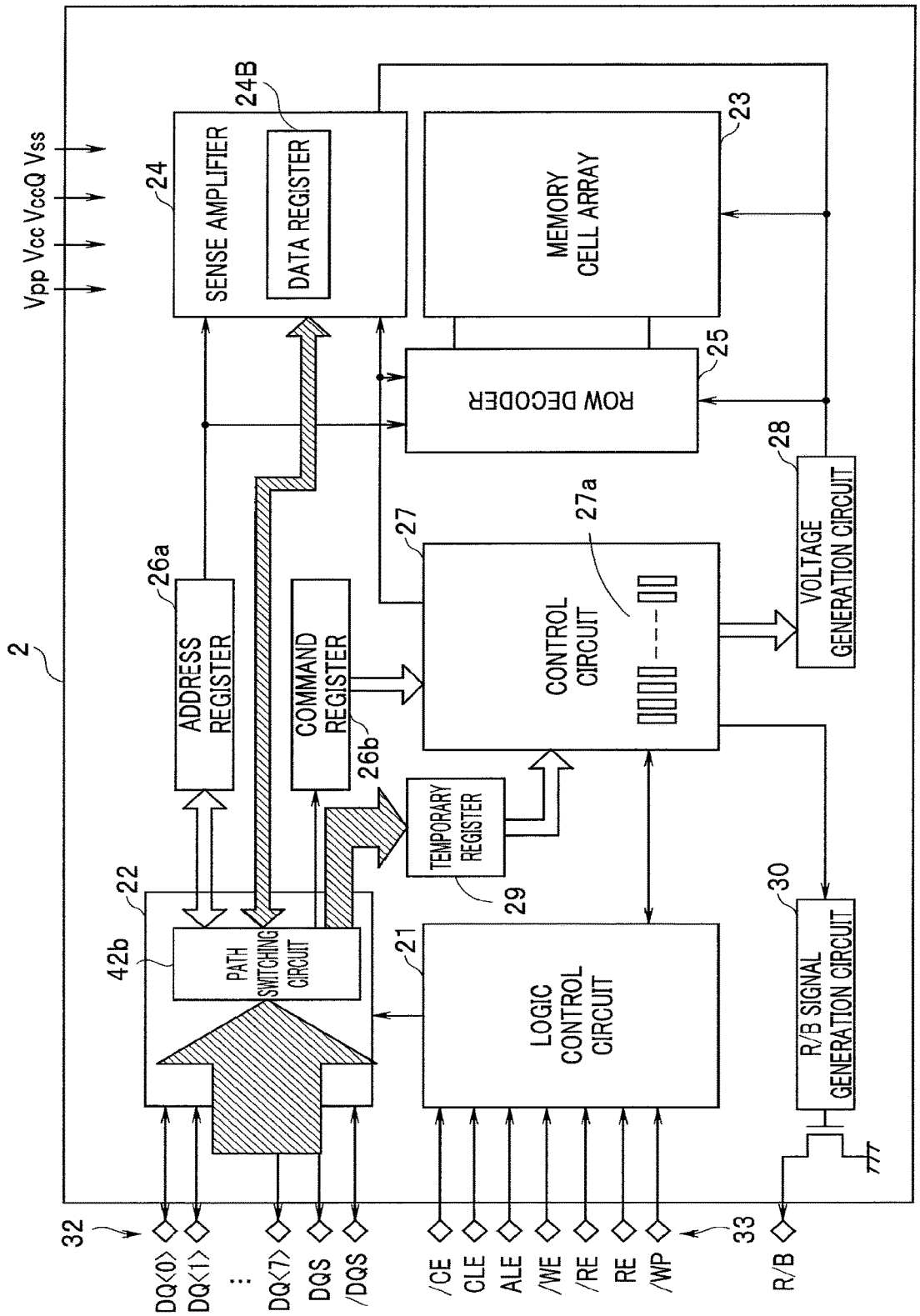
FIG. 12 is an explanatory diagram for explaining operation in the second embodiment.
Figure 13:
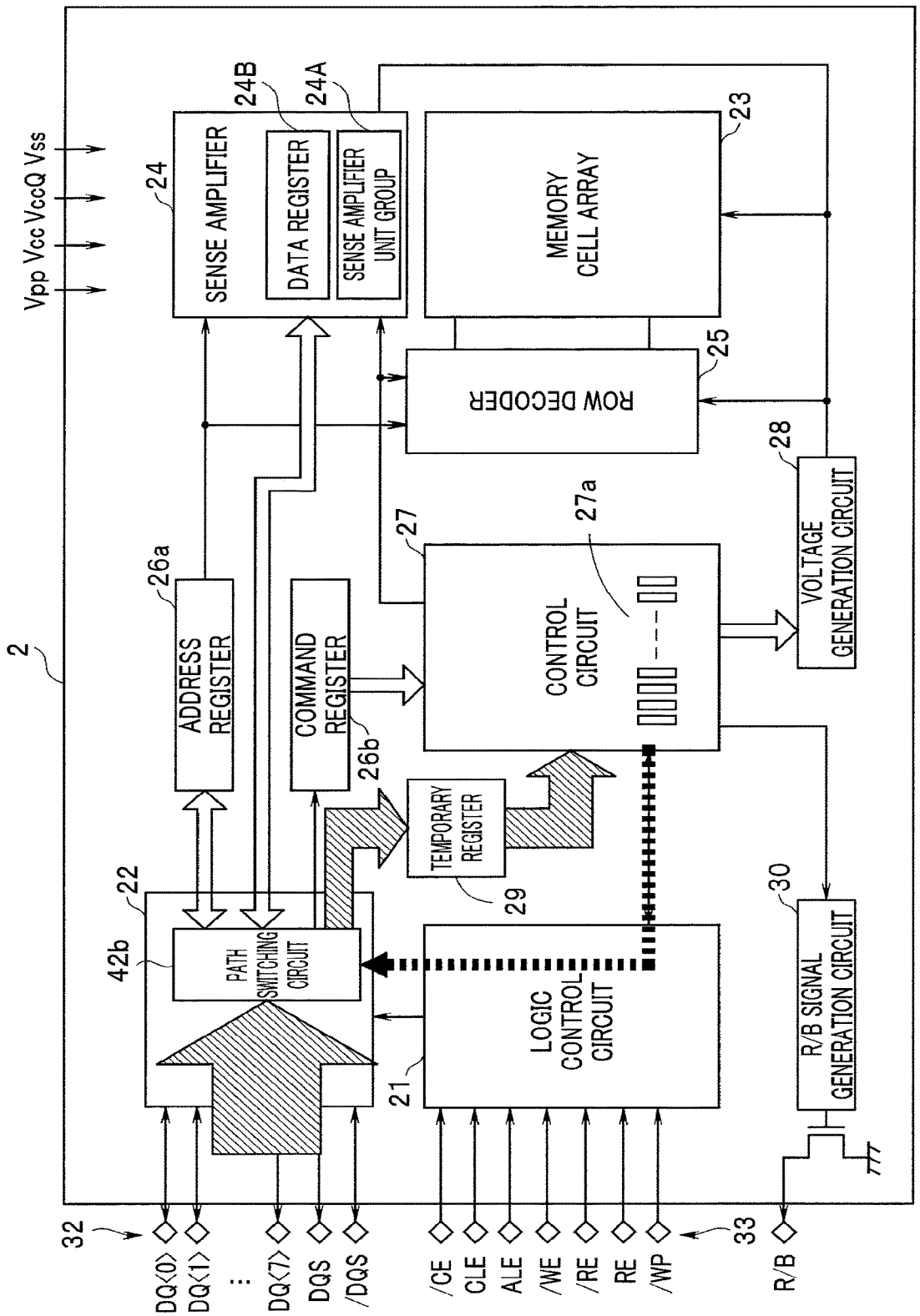
FIG. 13 is an explanatory diagram for explaining operation in the second embodiment.

Operation in this embodiment configured as explained above is explained with reference to FIGS. 11 to 13. FIG. 11 is a timing chart showing a Set Feature sequence in the second embodiment. FIGS. 12 and 13 are explanatory diagrams for explaining the operation in the second embodiment.

In this embodiment, as in the first embodiment, concerning command sequences such as a writing operation and a readout operation other than the Set Feature sequence, normal general sequences are adopted. For example, concerning the Set Feature sequence, a sequence shown in FIG. 11 is adopted.

The sequence shown in FIG. 11 is different from the sequence shown in FIG. 6 only in that the signal CLE and the signal ALE are not simultaneously activated. In other words, in FIG. 11, as in FIG. 6, the processor 12 of the memory controller 1 consecutively activates the signal /WE in the period tWC without causing the wait time tADL and the like to intervene from a start to an end of the Set Feature sequence. The processor 12 transfers the Set Feature command CMD, the address C_ADD, and the address F_ADD according to first three pulses of the signal /WE. Further, following the transmission of the address F_ADD, the processor 12 consecutively transmits the Set Feature data of D0 to D3 according to pulses of the signal /WE. In this embodiment, the processor 12 sets both of the signal CLE and the signal ALE in an inactive state during the transfer of the Set Feature data.

On the other hand, in the nonvolatile memory 2, operation of the path switching circuit 42b in the input/output circuit 22 during reception of the active signal CLE or signal ALE is the same as the operation in the first embodiment. The path switching circuit 42b gives the Set Feature command CMD to the command register 26b and gives the address F_ADD to the address register 26a.

In this embodiment, the logic control circuit 21 controls, in the inactive state of both of the signal CLE and the signal ALE, according to a pulse of the signal /WE, the path switching circuit 42b to transfer the reception signal DQ<7:0> received by the input/output circuit 22 to both of the data register 24B and the temporary register 29.

FIG. 12 shows, with a hatched arrow, a transfer path for the reception signal DQ<7:0> in this case. As shown in FIG. 12, in the inactive state of both of the signal CLE and the signal ALE, according to a fourth-time pulse of the signal /WE, the Set Feature data received by the input/output circuit 22 is transferred to and stored in the data register 24B and the temporary register 29.

A command stored in the command register 26b is transferred to the control circuit 27 and analyzed. The control circuit 27 requires a time for the analysis of the Set Feature command A result of the analysis is sometimes obtained after the reception of the Set Feature data. However, in this embodiment, the Set Feature data is temporarily stored in the temporary register 29 during the analysis of the Set Feature command in the control circuit 27. When obtaining an analysis result indicating that the received command is the Set Feature command, the control circuit 27 controls the logic control circuit 21 to control path selection by the path switching circuit 42b.

FIG. 13 shows, with a hatched arrow, a transfer path for the reception signal DQ<7:0> in this case. As shown in FIG. 13, the path switching circuit 42b continues the transfer of the Set Feature data to the temporary register 29 and, on the other hand, stops the transfer of the Set Feature data to the data register 24B ex post facto.

After the analysis of the Set Feature command, the control circuit 27 reads out the address F_ADD of the address register 26a and stores the Set Feature data transferred to the temporary register 29 in a corresponding region of the Feature register 27a.

As explained above, in this embodiment, the memory controller is capable of reducing a processing time for the Set Feature sequence by transferring, according to the consecutively generated signal /WE, not only the Set Feature command and address but also the Set Feature data. In the nonvolatile memory, by providing a temporary register that temporarily holds the Set Feature data and the path switching circuit enables control for transferring data to both of the data register and the temporary register. Consequently, even before the analysis of the Set Feature command, the Set Feature data can be surely stored in the temporary register. Consequently, it is possible to surely store the Set Feature data in a corresponding region of a corresponding Feature register and carry out the Set Feature sequence without requiring a wait time. It is possible to reduce the processing time for the Set Feature sequence.

Third Embodiment

Figure 14:
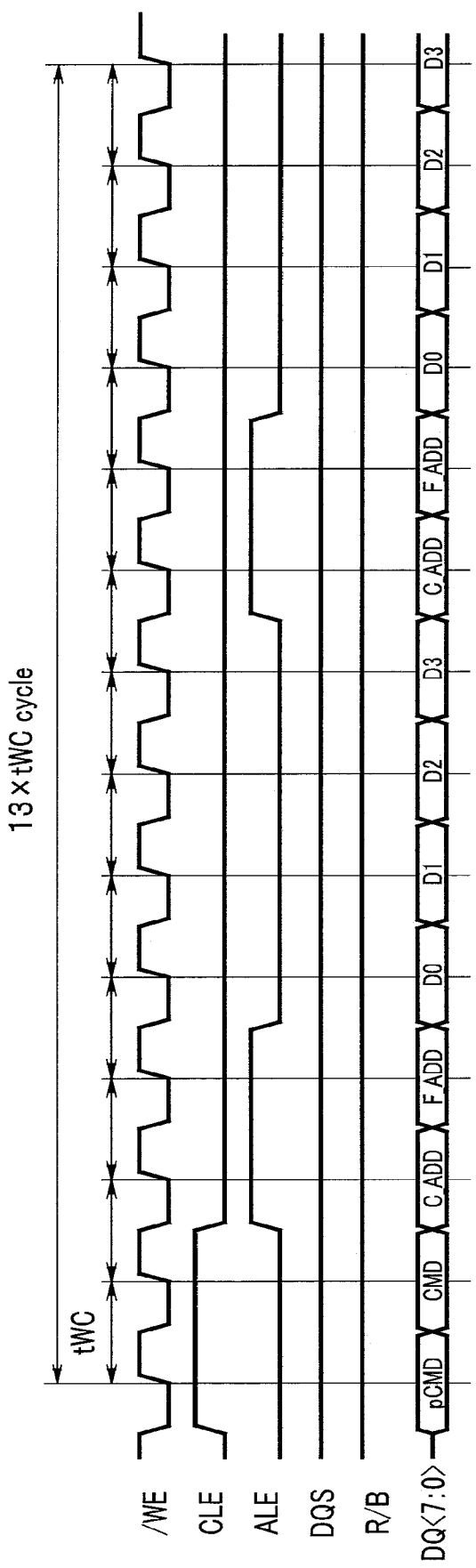
FIG. 14 is a timing chart showing a Set Feature sequence adopted in a third embodiment.

FIG. 14 is a timing chart showing a Set feature sequence adopted in the third embodiment. A hardware configuration in this embodiment is the same as the hardware configuration in the first or second embodiment shown in FIGS. 1 and 3 or FIGS. 1 and 10. This embodiment is an example in which Set Feature data is consecutively transmitted. This embodiment is applicable to both of the first and second embodiments. Note that FIG. 14 shows an example in which this embodiment is applied to the second embodiment.

As shown in FIG. 14, in this embodiment, as in the first and second embodiments, data necessary for the Set Feature sequence is transferred according to pulses of the signal /WE consecutively supplied in a predetermined period, for example, the period tWC. In the first and the second embodiments, an example is explained in which the Set Feature data is transferred following the Set Feature command CMD, the address C_ADD, and the address F_ADD. However, in some case, a plurality of kinds of Set Feature data need to be transmitted. In this embodiment, in this case, concerning the Set Feature data of second and subsequent times, the address C_ADD and the address F_ADD and the Set Feature data are consecutively transferred following transfer of the Set Feature data of a first time. Note that FIG. 14 shows an example in which two kinds of Set Feature data are transferred. This embodiment can also be applied when three or more kinds of Set Feature data are transferred.

As shown in FIG. 14, the processor 12 of the memory controller 1 consecutively activates the signal /WE in the period tWC without causing the wait time tADL and the like to intervene from a start to an end of the Set Feature sequence. The processor 12 transfers a command pCMD according to a first pulse of the signal /WE. The command pCMD indicates a prefix command and is a command input used to distinguish the Set Feature sequence from a normal Set Feature sequence. The following operation is declared as a consecutive Set Feature sequence by inputting the prefix command pCMD beforehand. The Set Feature command CMD can be omitted.

Subsequently, the processor 12 transfers the Set Feature command CMD, the address C_ADD, and the address F_ADD according to second-time to fourth-time three pulses of the signal /WE. Further, the processor 12 consecutively transmits Set Feature data of D0 to D3 according to fifth-time to eighth-time four pulses of the signal /WE following the transmission of F_ADD.

In this embodiment, the processor 12 performs transfer of the Set Feature data of a second time following transfer of the Set Feature data of a first time. In other words, the processor 12 transfers the address C_ADD and the address F_ADD according to ninth-time and tenth-time two pulses of the signal /WE. Further, the processor 12 consecutively transmits Set Feature data of D0 to D3 according to eleventh-time to fourteenth-time four pulses of the signal /WE.

Note that when this embodiment is applied to the first embodiment, the processor 12 activates the signal CLE and the signal ALE when the Set Feature data of D0 to D3 are transferred according to the fifth-time to the eighth-time and the eleventh-time to the fourteenth-time pulses of the signal /WE.

Operation in the nonvolatile memory 2 is the same as the operation in the first or second embodiment.

In this way, in the example shown in FIG. 14, a plurality of kinds of Set Feature data can be consecutively transferred by using the prefix command pCMD. Transfer of the Set Feature command CMD can be omitted during transfer of the Set Feature Data of second and subsequent times. For example, when N kinds of Set Feature data are consecutively transferred, in the first and second embodiments, a (N×7−1)tWC period is required. On the other hand, in the third embodiment, (2+N×6−1)tWC period is required. In other words, in the third embodiment, when three or more kinds of Set Feature data are consecutively transferred, it is possible to further reduce the Set Feature sequence. As there are more kinds of the Set Feature data, a reduction effect is higher.

Note that, in the example shown in FIG. 14, since a plurality of kinds of Set Feature data are consecutively transferred, concerning the Set Feature data of second and subsequent times, the control circuit 27 does not need to perform an analysis of the Set Feature command and can instruct a transfer destination of the Set Feature data of the second and subsequent times to the logic control circuit 21. In this way, the Set Feature data of the second and subsequent times are controlled to be consecutively transferred to the temporary register 29.

In other words, during the Set Feature data transfer of second and subsequent times, the control circuit 27 does not need to perform determination of a command and only has to sequentially store the received Set Feature data in the Feature register 27a according to the address F_ADD. It is possible to further reduce the processing time for the Set Feature sequence.

In this way, in this embodiment, as in the first and second embodiments, the same effects as the effects in the respective embodiments explained above can be obtained. It is possible to further reduce the Set Feature sequence.

Note that the respective embodiments are effective for a reduction of a processing time in not only shift read but also various kinds of Set Feature. For example, the embodiments are also effective for Set Feature in DCC training.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
    a nonvolatile memory including:
        a first pad capable of receiving a first control signal;
        a second pad capable of receiving a second control signal different from the first control signal; and
        a third pad capable of receiving at least one of a command, an address, and data as received data; and
    a memory controller including:
        a fourth pad capable of transmitting the first control signal to the nonvolatile memory;
        a fifth pad capable of transmitting the second control signal to the nonvolatile memory; and
        a sixth pad capable of transmitting the command, the address, and the data to the nonvolatile memory, wherein
    the first control signal instructs the nonvolatile memory to capture a writing command and a function setting command included in the command, a writing address and a function setting address included in the address, and function setting data included in the data,
    the second control signal instructs the nonvolatile memory to capture writing data included in the data,
    when the memory controller transmits a first command sequence including the writing command, the writing address, and the writing data to the nonvolatile memory, the memory controller transmits the writing command and the writing address in synchronization with the first control signal and transmits the writing data in synchronization with the first control signal, and
    when the memory controller transmits a second command sequence including the function setting command, the function setting address, and the function setting data to the nonvolatile memory, the memory controller transmits the function setting command, the function setting address, and the function setting data in synchronization with the first control signal.

2. The memory system according to claim 1, wherein
the nonvolatile memory further includes:
a seventh pad capable of receiving a third control signal indicating that a signal received in the third pad is the command; and
an eighth pad capable of receiving a fourth control signal indicating that the signal received in the third pad is the address,
the memory controller further includes:
a ninth pad capable of transmitting the third control signal to the nonvolatile memory; and
a tenth pad capable of transmitting the fourth control signal to the nonvolatile memory, and
when transmitting the second command sequence to the nonvolatile memory, the memory controller activates both of the third control signal and the fourth control signal in at least a partial period.

3. The memory system according to claim 1, wherein
when transmitting the second command sequence to the nonvolatile memory,
the memory controller inactivates the fourth control signal while activating the third control signal in a first period in which the function setting command is transmitted, activates the fourth control signal while inactivating the third control signal in a second period in which the function setting address is transmitted following the first period, and activates the fourth control signal while activating the third control signal in a third period in which the function setting data is transmitted following the second period.

4. The memory system according to claim 1, wherein
the command further includes an additional command,
the function setting address includes a first function setting address and a second function setting address,
the function setting data includes first function setting data and second function setting data,
the memory controller is capable of transmitting a third command sequence including the additional command, the function setting command, the first function setting address, the first function setting data, the second function setting address, and the second function setting data to the nonvolatile memory, and
in the third command sequence, the function setting command is not included between the first function setting data and the second function setting address.

5. The memory system according to claim 4, wherein, when transmitting the third command sequence to the nonvolatile memory, the memory controller transmits the function setting command before transmitting the first function setting address and omits the transmission of the function setting command before transmitting the second function setting address.

6. The memory system according to claim 5, wherein, when transmitting the third command sequence to the nonvolatile memory, the memory controller transmits the additional command, the function setting command, the first function setting address, the first function setting data, the second function setting address, and the second function setting data to the nonvolatile memory in synchronization with the first control signal.

7. The memory system according to claim 1, wherein, when transmitting the second command sequence to the nonvolatile memory, the memory controller periodically inverts the first control signal.

8. The memory system according to claim 1, wherein the nonvolatile memory further includes:
an input/output circuit connected to the third pad;
a data register connected to the input/output circuit and capable of storing the writing data;
a command register connected to the input/output circuit and capable of storing the command;
an address register connected to the input/output circuit and capable of storing the address; and
a temporary register connected to the input/output circuit and capable of storing the function setting data.

9. The memory system according to claim 8, wherein the input/output circuit includes a path switching circuit capable of controlling transfer of the received data received in the third pad to each of the data register, the command register, the address register, and the temporary register.

10. The memory system according to claim 9, wherein the nonvolatile memory further includes:
a seventh pad capable of receiving a third control signal indicating that a signal received in the third pad is the command; and
an eighth pad capable of receiving a fourth control signal indicating that the signal received in the third pad is the address,
the memory controller further includes:
a ninth pad capable of transmitting the third control signal to the nonvolatile memory; and
a tenth pad capable of transmitting the fourth control signal to the nonvolatile memory, and
the path switching circuit causes the command register to store the received data received in the third pad as the command when the third control signal received from the controller is activated and the fourth control signal received from the controller is inactivated, causes the address register to store the received data received in the third pad as the address when the fourth control signal received from the controller is activated and the second control signal received from the controller is inactivated, and causes both of the data register and the temporary register to store the received data received in the third pad when both of the third control signal and the fourth control signal received from the controller are inactivated.

11. The memory system according to claim 10, wherein the path switching circuit stops the transfer from the input/output circuit to the data register or the temporary register after the received data received in the third pad is stored in both of the data register and the temporary register.

12. The memory system according to claim 2, wherein the nonvolatile memory further includes:
an input/output circuit connected to the third pad;
a data register connected to the input/output circuit and capable of storing the writing data;
a command register connected to the input/output circuit and capable of storing the command;
an address register connected to the input/output circuit and capable of storing the address; and
a temporary register connected to the input/output circuit and capable of storing the function setting data.

13. The memory system according to claim 12, wherein the input/output circuit includes a path switching circuit capable of controlling the transfer of the received data received in the third pad to the data register, the command register, the address register, and the temporary register.

14. The memory system according to claim 12, wherein the path switching circuit causes the command register to store the received data received in the third pad as the command when the third control signal received from the controller is activated and the fourth control signal received from the controller is inactivated, causes the address register to store the received data received in the third pad as the address when the fourth control signal received from the controller is activated and the third control signal received from the controller is inactivated, and causes the temporary register to store the received data received in the third pad as the function setting data when both of the third control signal and the fourth control signal received from the controller are activated.

15. The memory system according to claim 1, wherein the second control signal is a data strobe (DQS) signal that enables data transfer at a double data rate, and the first control signal is a write enable (/WE) signal that enables data transfer at a single data rate.

* * * * *